United States Patent [19]

Furumoto

[11] 4,326,256
[45] Apr. 20, 1982

[54] FREQUENCY DISCRIMINATING CIRCUIT

[75] Inventor: Takayuki Furumoto, Yokohama, Japan

[73] Assignee: Hitachi, Ltd., Tokyo, Japan

[21] Appl. No.: 74,147

[22] Filed: Sep. 10, 1979

[30] Foreign Application Priority Data

Sep. 8, 1978 [JP] Japan .................................. 53-109822

[51] Int. Cl.³ .......................... G01R 23/00; H04M 1/00
[52] U.S. Cl. ................................ 364/484; 179/84 VF;
235/92 FQ; 307/231; 328/138
[58] Field of Search ................ 364/484; 235/92 FQ;
340/146.2; 179/84 VF; 324/78 D, 79 R, 79 D, 85; 328/133, 138; 307/210, 220 R, 231, 233 R, 233 A, 271, 295, 510, 519

[56] References Cited

U.S. PATENT DOCUMENTS

| 3,287,655 | 11/1966 | Venn et al. | 307/231 |
| 3,917,927 | 11/1975 | Minton | 235/92 FQ |
| 3,949,177 | 4/1976 | Ball et al. | 179/84 VF |
| 3,962,645 | 6/1976 | Stewart | 328/138 |
| 3,979,562 | 9/1976 | Rice | 179/84 VF |
| 4,027,102 | 5/1977 | Ando et al. | 179/84 VF |
| 4,178,631 | 12/1979 | Nelson, Jr. | 364/484 |

OTHER PUBLICATIONS

Minchenko; "New Tone Detector for Automatic Trunk Testing"; Bell Labs. Record; vol. 45, No. 5; May 1967; pp. 149-152.

Primary Examiner—Errol A. Krass
Attorney, Agent, or Firm—Craig and Antonelli

[57] ABSTRACT

The frequency of an input signal is converted to a corresponding digital quantity and the digital quantity is then compared with preset reference values thereby to discriminate the frequency of the input signal.

8 Claims, 9 Drawing Figures

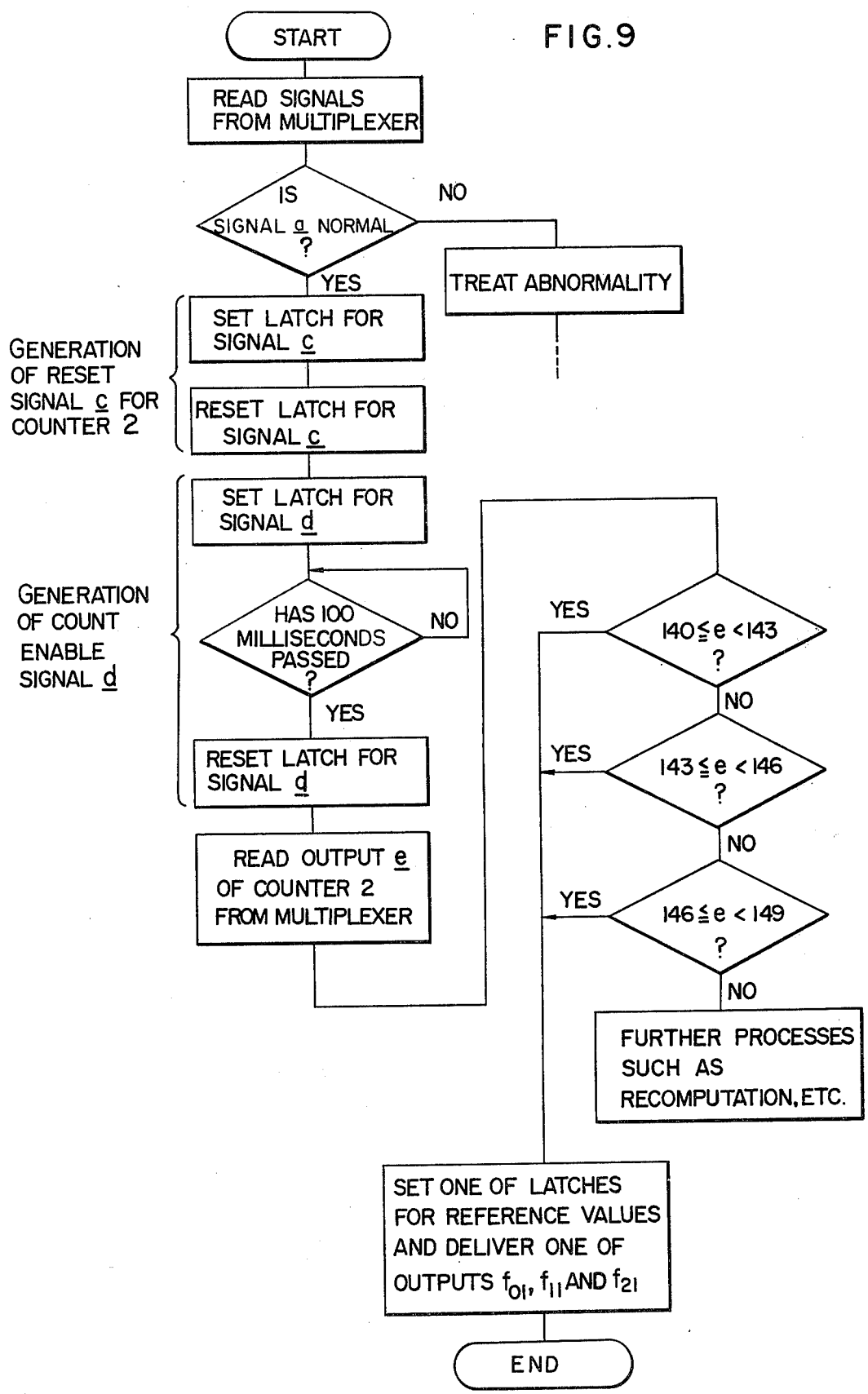

FREQUENCY DISCRIMINATING CIRCUIT

BACKGROUND OF THE INVENTION

This invention relates to a frequency discriminating circuit, in more particular, to a circuit for discriminating the frequency of an input signal or tone signal in a digital manner.

The last few years have experienced a remarkable development of techniques for processing information and the fruits of the development have come to be enjoyed by society. This has greatly affected the telecommunication technology and has led to a plan for a large-scale car-telephone network.

Such a car-telephone network is constituted in the following manner. A radio local zone is provided with a radio base station which allotted voice channels corresponding in number to the subscribers in the radio local zone. A control zone, constituted by a plurality of such radio local zones, is provided with a radio circuit control station which controls the radio base stations belonging to the control zone to establish radio or wireless circuits between the radio base stations and mobile stations (e.g. car-mounted telephone sets). A car telephone exchange station is provided for a plurality of such radio circuit control stations so as to serve to connect the mobile telephone circuits with ordinary telephone circuits and to charge the subscribers therefor.

In a mobile wireless service such as a the radio equipment mounted on a taxicab, human voice is directly used to call for a desired person so that signal control is very easy. In the case of car telephone system, however, many subscribers share a single channel with one another and moreover the connection of one channel with another is established automatically. Therefore, radio channels must be used to control originating and terminating calls.

In conventional mobile radio communication systems, car telephone systems, or the like, whenever any speech circuit has been established, a tone of a predetermined frequency within or outside the frequency band of speech voice is sent out of the base station so as to ascertain the establishment of the speech circuit desired while the mobile station receives the tone and sends back another tone indicative of the reception of the tone to the base station. Upon reception of the tone sent back from the mobile station by the base station, the completion of the establishment of the speech circuit is ascertained. The most important matter in this ascertaining operation is the frequency discriminating power of the mobile and base stations. If one or both of the stations have a poor power for discriminating frequencies, it will be impossible to ascertain the establishment of any speech circuit even if it is completed.

The necessity of discriminating the frequency of an input signal is sometimes encountered in situations other than the above described case, and the frequency discriminating means now in wide use for such situations is a filter constructed in an analog fashion. However, although such a filter can satisfactorily discriminate the frequency of an input signal in the case where input signals have all the same frequency or they have more than one frequency of which one is different from another by more than a certain sufficiently large value, it is difficult to discriminate between two adjacent frequencies in the case where the input signals have two or more frequencies and the difference between the adjacent frequencies is slight. To enable the filter to discriminate frequencies even in the latter case, the filter must have a complicated structure and therefore be expensive. Hence, there is a reasonable limit to the frequency discrimination by the use of an analog filter.

SUMMARY OF THE INVENTION

An object of this invention is to provide a frequency discriminating circuit which is composed of simple digital components and can securely discriminate more than one frequency of input signals even if each frequency is only slightly different from the adjacent one.

According to one feature of this invention, which has been made to attain the above object, the pulse train obtained through the digital conversion of the input or tone signal is supplied to a counter so as to be counted for a certain time and the frequency of the input or tone signal is discriminated by comparing the count value of the counter with the previously prepared reference frequency.

According to another feature of this invention, a microprocessor is used to discriminate the frequencies of input signals.

For this purpose, according to this invention, a count enable signal is used as a count start signal or a count stop signal.

Another object of this invention is to simplify the overall circuit configuration by employing the above described features.

BRIEF DESCRIPTION OF THE DRAWINGS

FIG. 9 is a flow chart for illustrating the operation of the microprocessor used as the control circuit in this invention.

DESCRIPTION OF THE PREFERRED EMBODIMENT

Figure 1:
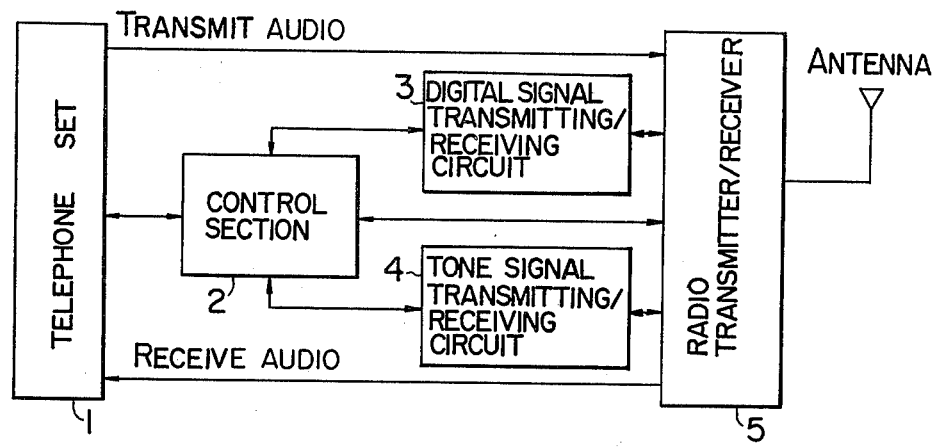
FIG. 1 schematically shows the circuit configuration of a telephone set mounted in a mobile body.

In FIG. 1 showing in block diagram the circuit configuration of a telephone set mounted in a mobile body such as an automobile (i.e. car-mounted telephone set), reference numeral 1 designates a telephone set including a handset and a telephone body, the handset comprising a receiver disposed on the upper side of a push button pad and a transmitter on the lower side of the push button pad, as in the case of an ordinary telephone set, and the transmitter serving as a calling sound generator as well as a dynamic microphone; 2 a control section comprising a control circuit, a flip-flop, a counter, a comparator, a reference value generator, a microprocessor, a memory, a latch circuit and a multiplexer; 3 a digital signal transmitting/receiving circuit; 4 a tone signal transmitting/receiving circuit; and 5 a radio transmitter/receiver comprising a radio transmitting section, a radio receiving section a synthesizer section, a power supply section, a transmitting power amplifier section and an antenna duplexer/branching filter.

Figure 2:
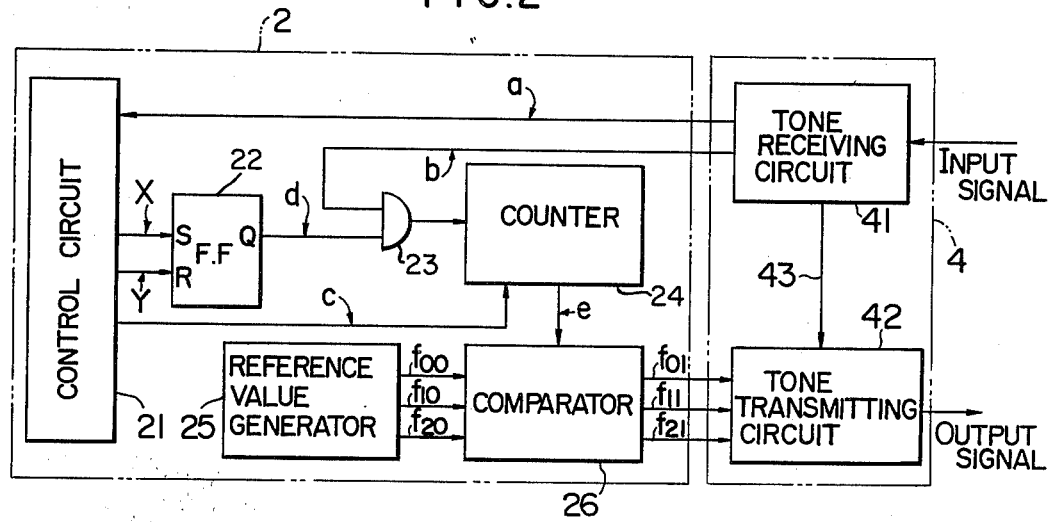
FIG. 2 shows in block diagram a frequency discriminating circuit as an embodiment of this invention.
Figure 3:
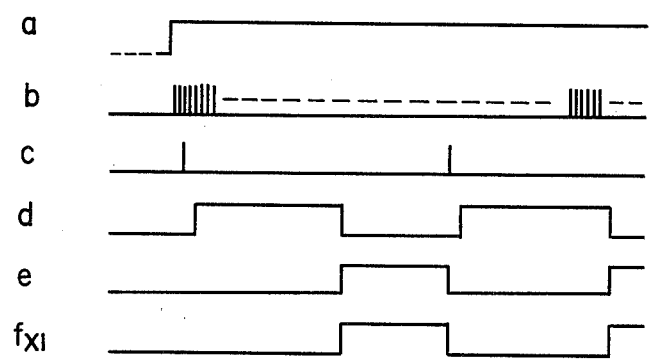
FIG. 3 shows the waveforms appearing at several points in the circuit shown in FIG. 2.

FIG. 2 schematically shows the contents of the control section 2 and the tone signal transmitting/receiving circuit 4 which constitutes a frequency discriminating circuit as an embodiment of this invention. In FIG. 2, reference numeral 41 designates a tone signal receiving circuit for receiving the tone signal received by the radio receiver 5; 22 a set reset flip-flop circuit the output Q of which is a count enable signal and which is set by a count start signal X and reset by a count stop signal Y sent from a control circuit 21 in response to a signal which indicates a receiving state of a tone signal at the tone receiving circuit 41; 23 an AND gate the input signals of which are a signal b from the tone receiving circuit 41 and a count enable signal d from the flip-flop circuit 22; 24 a binary counter; 25 a reference value generator; 26 a comparator; and 42 a tone transmitting circuit.

Now, the operation of the thus arranged frequency discriminating circuit according to this invention will be described.

When an input or tone signal is received by the tone receiving circuit 41, an output signal a indicating the presence of the input signal is delivered by the circuit 41 while the same circuit 41 delivers another output signal b to the AND gate 23, the output b being a digital signal processed through half-wave rectification and waveshaping. Under this condition, the counter 24 is reset into the initial state by the a reset signal c from the control circuit 21 and then the count enable signal d is supplied from the flip-flop 22 to the AND gate. The AND gate 23 passes the input signal b only while the count enable signal d is being delivered from the flip-flop 22. The output pulses of the AND gate 23, i.e. the output b of the tone receiving circuit 41, are counted by the binary counter 24 and the a count value e is preserved. The count value e is compared with reference values $f_{x0}$ ($x=0 \sim 2$; in this embodiment $x=0$ and therefore $f_{00}$) for frequency discrimination from the reference value generator 25 in the comparator 26 in the absence of the count enable signal d. As a result of this comparison, the comparator 26 delivers a frequency discrimination output $f_{x1}$ (in this embodiment $x=0$ and therefore $f_{01}$).

In the further detail of the comparison operation, assume, for example, that the frequency $f_x$ of the input or tone signal b to be discriminated may take one of the values $f_0 = 3970$ Hz, $f_1 = 4000$ Hz and $f_2 = 4030$ Hz and that the count enable signal d continues to exist for 100 milliseconds. Then, the reference values $f_{00}-f_{20}$ for frequency discrimination are so set that $396 \leq f_{00} < 399$, $399 \leq f_{10} < 402$ and $402 \leq f_{20} < 405$. Accordingly, if the count value e of the counter 24 which counts the frequency $f_x$ of the input signal b for 100 milliseconds is such that $396 \leq e < 399$, $399 \leq e < 402$ or $402 \leq e < 405$, the comparator 26 delivers the corresponding frequency discriminating output $f_{01}$, $f_{11}$ or $f_{21}$, respectively. Therefore, if the frequency $f_x$ of the input or tone signal b takes its value such that $3960 \leq f_x < 3990$ Hz $\leq f_x < 4020$ Hz, or $4020$ Hz $\leq f_x < 4050$ Hz, the comparator 26 can deliver the corresponding frequency discriminating outputs $f_{01}$, $f_{11}$ or $f_{21}$, respectively.

Figure 4:
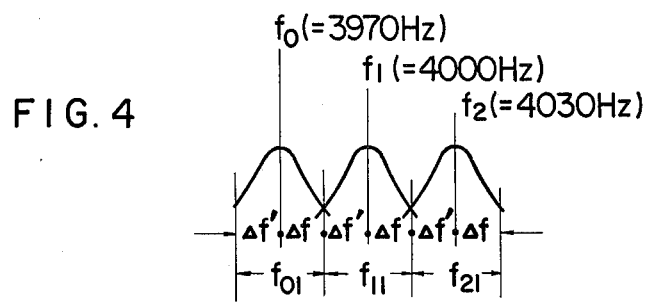
FIG. 4 graphically shows the relationships among the frequencies of the input/output signals and the output signal from the frequency discriminating circuit.

FIG. 4 shows the relationship between the frequency $f_x$ of the input signal b and the frequency discriminating output $f_{x1}$, $\Delta f'$ and $\Delta f$ in the figure being equal to 15 Hz in this embodiment. If the count value e of the binary counter 24 corresponding to the frequency $f_x$ of the input signal b is such that $396 \leq e < 405$, the frequency $f_x$ can be determined to be 3970 Hz, 4000 Hz or 4030 Hz.

The input or tone signal is supplied from the tone receiving circuit 41 to the tone transmitting circuit 42 via a line 43. The input or tone signal is sent back to the base station after it has been phase-controlled by the outputs $f_{01}$, $f_{11}$ or $f_{21}$ of the comparator 26 produced as a result of the above comparison. Upon reception of the tone signal sent back from the mobile station, the base station ascertains that a desired speech circuit has been established. Therefore, when any one of the outputs $f_{01}$, $f_{11}$ and $f_{21}$ are not delivered, the base station recognizes that a fault has occurred either in the circuit or in the mobile station.

Figure 5:
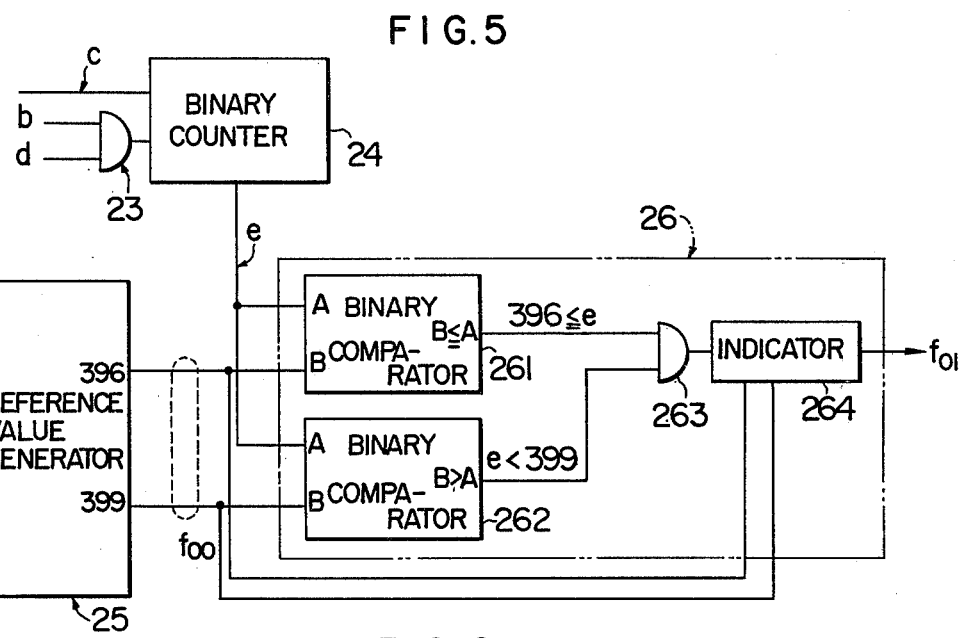
FIG. 5 shows a concrete example of a comparator used in the frequency discriminating circuit according to this invention.

FIG. 5 shows in further detail the above described comparator 26, in which reference numerals 261 and 262 designate binary comparators (which can be commercially available 4 bit magnitude comparators) connected to the respective outputs of the reference value generator 25 and to the output of the binary counter 24. The binary comparator 261 delivers its output when it receive inputs A and B and B is not larger than A, namely when the count value e of the counter 24 is not smaller than the reference value 396 produced by the reference value generator 25 as the result of comparison between the count value e and the reference value 396. Similarly, the binary comparator 262 delivers its output when its input B is larger than A, namely when the count value e is smaller than the reference value 399. The reference numeral 263 designates an AND gate for delivering an output from the outputs of the binary comparators 261 and 262, when $396 \leq e < 399$, for example.

Reference numeral 264 designates an indicator which produces an output $f_1$, for example in this case, to indicate that the input or tone signal is within the range from $f_0 - \Delta f'$ to $f_0 + \Delta f$, for example in this case, in response to the output signal of the AND gate 263 and the set values "396" and "399" of the reference value generator 25. Of course, when the reference values are set as "399" and "402" the indicator 264 produces its output signal $f_{11}$, while when the reference values are set as "402" and "405" it produces the output signal $f_{21}$.

Figure 6:
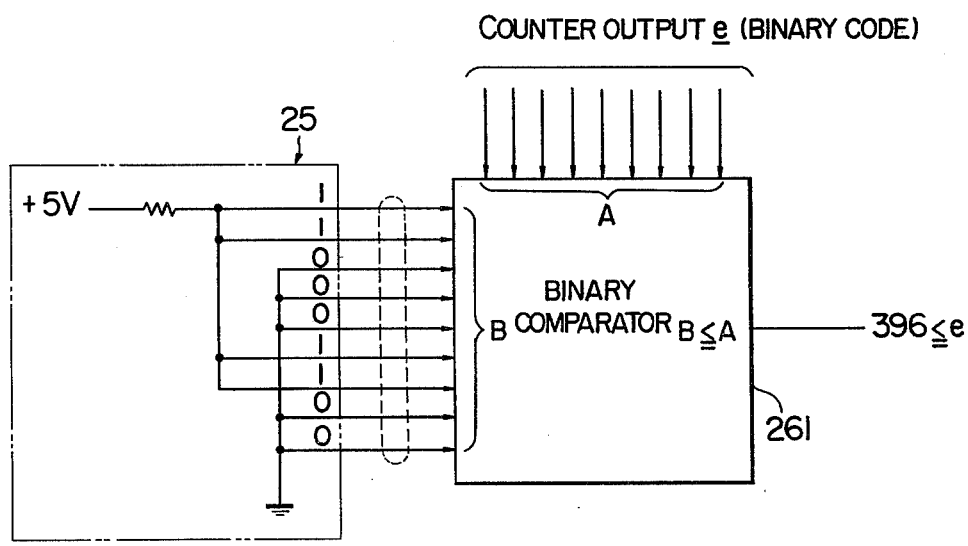
FIG. 6 shows a concrete example of a reference value generator used in the frequency discriminating circuit according to this invention.

FIG. 6 shows in further detail the relationship between the reference value generator 25 and the binary comparator 261. The output e (binary code) of the binary counter 24 is compared with the binary-converted version "110001100" of the output "396" (decimal number) of the reference value generator 25, for example, in the binary comparator 261 ("399", "402" and "405" are also subjected to like comparisons). The binary comparator 261 then delivers an output only when the output e of the counter 24 (input A to the comparator 261) is equal to or exceeds the output of the reference value generator 25 (inputs B to the comparator 261) (namely only when 396 $396 \leq e$ for example). The function of the binary comparator 262 is similar to the comparator 261, but it delivers an output only when the output e of the counter 24 (input A to the comparator 262) is smaller than the output of the reference value generator 25

(input B to the comparator 262) (namely only when 399>e for example).

In the reference value generator 25, a plurality of circuits are provided for generating binary signals of the reference values 396, 399, 402, 405, etc., as shown FIG. 6 in which only one circuit generates the binary signal of the reference value 396. In use, these circuit are selected in such a manner that two adjacent reference values, for example "396" and "399", the difference therebetween corresponding to 30 Hz are produced from the reference value generator.

Figure 7:
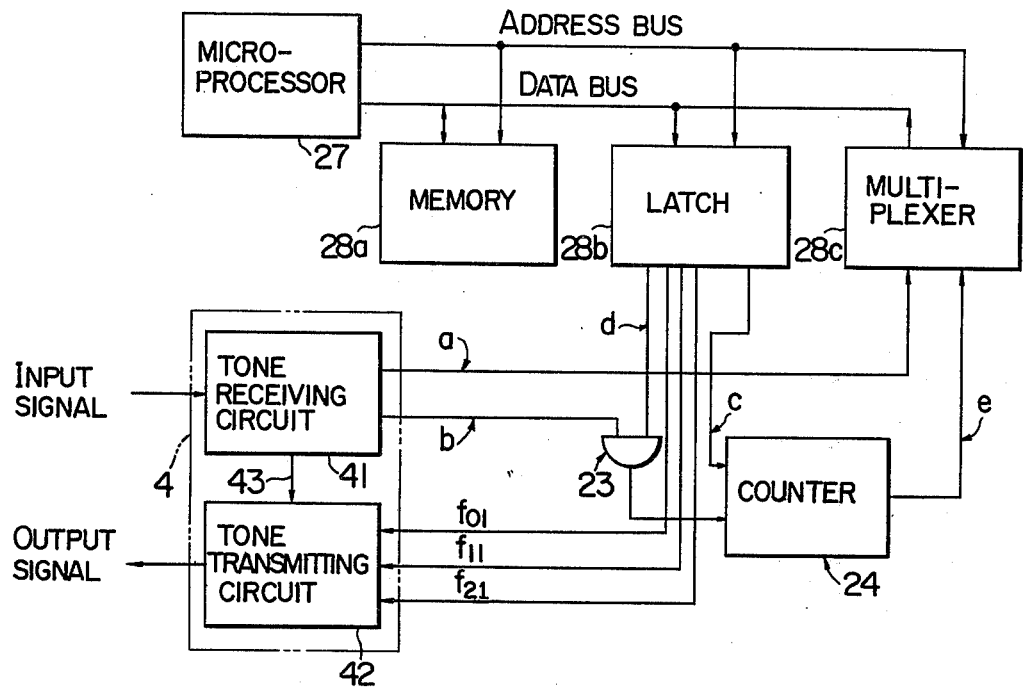
FIG. 7 shows in block diagram a frequency discriminating circuit as another embodiment of this invention, in which a microprocessor is used as the control circuit.

FIG. 7 shows another example of the control section 2 in FIG. 1, which uses a microprocessor. In FIG. 7, reference numeral 27 indicates a microprocessor; 28a a memory; 28b a latch circuit; 28c a multiplexer; 29a an address bus; and 29b a data bus.

Figure 8:
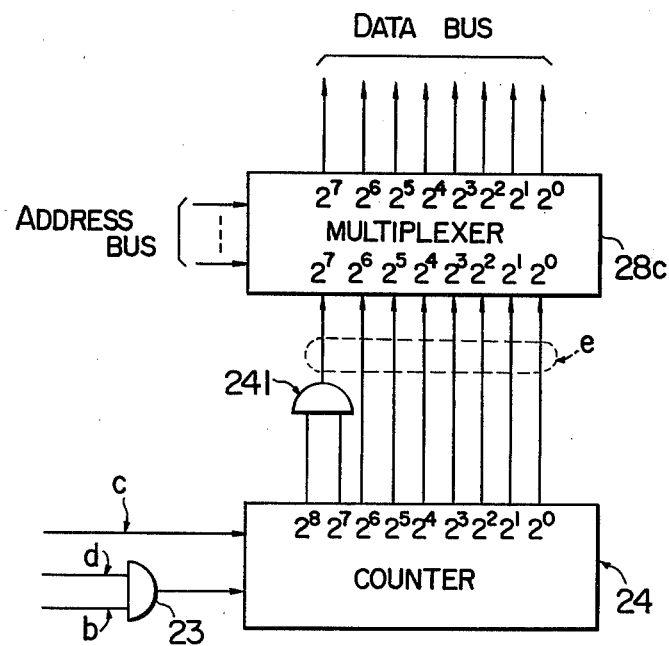
FIG. 8 shows in further detail the counter and the multiplexer used in this invention.

FIG. 8 shows in further detail the relationship between the counter 24 and the multiplexer 28c. In this case, it is assumed that an 8-bit multiplexer presently available on the market is used. When the frequencies 3970 Hz, 4000 Hz and 4030 Hz of the input signal b are counted for 100 milliseconds by the 9-bit binary counter 24 to convert the values in a range of 396–404, especially, for example, a number '396' into the corresponding binary number '110001100', the multiplexer 28c adapted for 8-bit signals cannot read the binary number '110001100' consisting of 9 bits. Therefore, to convert the 9-bit output of the counter 24 into the corresponding 8-bit code, an AND gate 241 is provided to receive the outputs $2^7$ and $2^8$ as its input and to deliver its output to the input $2^7$ of the multiplexer 28c. With this addition of the AND gate 241, the multiplexer 28c can read the output of the counter 24. Accordingly, the value to be compared in this case according to the program in the microprocessor 27 is '10001100', that is, decimal number 140 and the reference values $f_{00}$, $f_{10}$ and $f_{20}$ stored in the memory 28a are such that $140 \leq f_{00} < 143$, $143 \leq f_{10} < 146$ and $146 \leq f_{20} < 149$.

FIG. 9 shows in flow chart the steps of the above process.

As described above, according to this invention, the control section 2 may comprise an AND gate, a counter, a reference value generator, a comparator etc., but the control section 2 may be replaced by a computer such as a microprocessor. In that case, the overall circuit configuration can be simplified since the memory in the computer and the program stored in the memory can cover the function of generating the reset signal for the counter and the count enable signal for the AND gate and the function of the comparator. Since the microprocessor is now available inexpensively, the merit of this invention seems considerable.

Although in the above-description of preferred embodiment only three frequencies $f_0$ (3970 Hz), $f_1$ (4000 Hz) and $f_2$ (4030 Hz) have been shown, it will be easily appreciated that the number of these frequencies of tone signals are not limited to three but a suitable number of frequencies may be used for the tone signals. Further, although the frequency difference between two adjacent tone signal frequencies, for example $f_0$ and $f_1$, $f_1$ and $f_2$, or $f_2$ and $f_3$, has been shown to be 30 Hz, it is not limited to this value 30 Hz but may be selected to a predetermined proper value other than 30 Hz.

What is claimed is:

1. A frequency discriminating circuit for determining whether a received input signal has a predetermined frequency wherein the input signal is converted to a digital signal and the digital-converted input signal is gate-controlled for a given period of time by a count enable signal, and further wherein a count value of a counter which counts the number of pulses of the gate-controlled digital input signal is compared in a comparator with respective reference values representing predetermined frequencies generated by a reference value generator to determine if the input signal corresponds to one of said predetermined frequencies.

2. A frequency discriminating circuit for determining whether a received tone signal has a predetermined frequency comprising a tone signal receiving circuit for receiving said tone signal and for delivering a first signal indicating the presence of said tone signal and a second signal of a digital-converted version of said tone signal; a control circuit for delivering a count enable signal in response to said first signal; an AND gate for producing a count signal from said second signal and said count enable signal; a counter for counting the count signal from the output of said AND gate; and a comparator for comparing the count value of said counter with predetermined reference values representing predetermined frequencies to determine if the frequency of said tone signal corresponds to one of said predetermined frequencies.

3. A frequency discriminating circuit as claimed in claim 2, wherein said control circuit comprises a microprocessor and a memory circuit connected to said microprocessor for storing data to be used by said microprocessor, said microprocessor being coupled to said tone signal receiving circuit through a multiplexer and coupled to said counter through a latch circuit.

4. A frequency discriminating circuit as claimed in claim 3, wherein before the output of said counter is multiplexed by said multiplexer and said multiplexed values are compared with the reference values stored in said memory, the upper two bits of a 9-bit output of said counter are converted to a single bit by an AND gate so that the resultant 8-bit signal is supplied to said multiplexer which has 8-bit inputs.

5. A frequency discriminating circuit as defined in claim 2, wherein said circuit for comparing said output of said counter with said reference values comprises means for generating said predetermined reference values, a plurality of binary comparators each having two inputs one of which is connected to the output of said counter and the other of which is connected to said reference value generating means such that difference reference values are delivered to the respective binary comparators, and an AND gate for delivering a result of the frequency discriminator from the outputs of said binary comparators.

6. A frequency discriminating circuit as claimed in claim 2, wherein each of said counter and means for generating said predetermined reference value delivers a 9-bit binary output.

7. A frequency discriminating circuit as claimed in claim 1 or 2, wherein said comparator further determines whether said input signal has a frequency which lies between two adjacent ones of said predetermined frequencies.

8. A frequency discriminating circuit as claimed in claim 1 or 2, wherein the duration of the count enable signal is preset to be a constant value for providing an adequate counting time for said counter to supply a count value to said comparator to permit said comparator to discriminate a signal having one of said predetermined frequencies.

* * * * *